United States Patent
Dornbach

(10) Patent No.: US 8,700,868 B1
(45) Date of Patent: Apr. 15, 2014

(54) METHODS AND SYSTEMS FOR INCREMENTING A LOGARITHMIC COUNT

(75) Inventor: Peter Dornbach, Adliswil (CH)

(73) Assignee: Google Inc., Mountain View, CA (US)

( * ) Notice: Subject to any disclaimer, the term of this patent is extended or adjusted under 35 U.S.C. 154(b) by 124 days.

(21) Appl. No.: 13/479,789

(22) Filed: May 24, 2012

(51) Int. Cl.
*G06F 12/04* (2006.01)
*G06F 7/46* (2006.01)
*G06F 7/483* (2006.01)

(52) U.S. Cl.
CPC ............... *G06F 7/46* (2013.01); *G06F 7/4833* (2013.01); *G06F 12/04* (2013.01)
USPC .................................................. 711/154

(58) Field of Classification Search
CPC ..... G06F 1/0307; G06F 2101/10; G06F 7/46; G06F 7/461; G06F 7/4833; G06F 7/764; G06F 12/04
USPC .......... 711/154, 155; 708/273, 277, 512, 517, 708/851
See application file for complete search history.

(56) References Cited

U.S. PATENT DOCUMENTS

2009/0150421 A1\* 6/2009 Rjaibi et al. .................. 707/101

OTHER PUBLICATIONS

Nilanjan Mukherjee et al., "High-speed on-chip event counters for embedded systems," 2009 22nd International Conference on VLSI Design, DOI 10.1109/VLSI Design.2009.15, IEEE Computer Society.\*

Robert Morris, "Counting Large Numbers of Events in Small Registers," ACM 0001-0782/78/1000-0840, Communications of the ACM, vol. 21, No. 10, Oct. 1978.\*

\* cited by examiner

*Primary Examiner* — Hal Schnee
(74) *Attorney, Agent, or Firm* — Brake Hughes Bellermann LLP

(57) ABSTRACT

According to one general aspect, a method is provided for managing memory when tracking an estimated number of events, the method using a logarithmic count to track the estimated number. The method may detect a new occurrence of the event and increment the logarithmic count when no bits in a random number are in bit positions of significance. The bit positions of significance may be based on the value of the logarithmic counter and may be represented by bits having a non-zero value in a bitmask.

21 Claims, 4 Drawing Sheets

METHODS AND SYSTEMS FOR INCREMENTING A LOGARITHMIC COUNT

TECHNICAL FIELD

This disclosure generally relates to estimating a count of events, and in particular to the use of memory-conscious techniques to increment a logarithmic count of events.

BACKGROUND

Many organizations have a need to track the number of times an event, such as the appearance of a value, occurs. For example, an organization may wish to determine the number of times a webpage has been viewed, the number of DNS requests made for a particular URL (Uniform Resource Locator), etc. For example, in indexing a large number of documents by phrases it may be beneficial to count the number of times an n-gram of words, also referred to as a shingle, occurs in the content of crawled web pages. An n-gram is a group of n sequential words, where n is a number, usually between 2 and 8, although it can be any number. Such a count may be stored for each event, for example each occurrence of a shingle, and the counts can be used by the indexing system to optimize the index, for example, by locating phrase posting lists for different shingles within the index according to the respective counts for each shingle. But for space-critical applications, such as an index of events with hundreds of billions of records or an index of events stored in main-memory, storing the actual number of event occurrences may require too much memory. In such situations the system may store a logarithmic counter that estimates the actual count, instead of a true counter.

A logarithmic count estimates the actual count by an order of magnitude. For example a binary logarithmic count (log 2) with a value of "2" may represent an actual count of a number ranging from $2^2$ (or 4) and $2^3-1$ (or 7). Similarly, a log 10 count with a value of "2" may represent an actual count of a number ranging from $10^2$ (or 100) and $10^3-1$ (or 999). Substantial memory savings can be obtained with higher orders of magnitude. For example a log 2 counter with a value of 15, which can be represented by as few as four bits, corresponds to an actual count ranging between 32,768 and 65,535, which requires at least 16 bits to store. While the use of a logarithmic counter results in a substantial savings in memory, it has limited use for an active counter that must continue to track new occurrences of an event. The limitation arises because when the system encounters a new occurrence of the event, the logarithmic counter cannot just be increased by one. Doing so would result in an increase in an order of magnitude, rather than adding one to the estimated count of events represented by the value of the counter.

SUMMARY

According to one general aspect, a computer-implemented method for of managing memory usage while tracking an estimated number of occurrences of an event includes detecting a new occurrence of the event and retrieving, from a memory, a logarithmic count of the number of occurrences of the event, the logarithmic count having a value stored in the memory. The method may include determining bit positions having significance based on the value of the logarithmic count, generating a random number, and determining whether the random number has a non-zero bit in a position that corresponds with the bit positions having significance. When the random number does not have a non-zero bit in a position that corresponds with the bit positions having significance, the method may further include increasing the logarithmic counter and storing the logarithmic count in the memory. In some implementations, determining bit positions having significance may comprise creating a bitmask with non-zero values in the bit positions having significance and zero values in the remaining bit positions, the bitmask using a particular number of bits in the memory.

According to another general aspect, creating the bitmask may comprise calculating a shift differential, initializing a leftmost bit in a bitmask to zero and initializing the remaining bits in the bitmask to non-zero values, the bitmask using a particular number of bits in the memory, and right-shifting the bits in the bitmask by the shift differential. In some implementations, calculating the shift differential may include subtracting the logarithmic count from the particular number of bits less one.

According to yet another general aspect, a tangible computer-readable storage medium including recorded and stored instructions is described. The instructions, when executed by one or more processors of a computer system, may cause the computer system to detect a new occurrence of the event and retrieving, from a memory, a logarithmic count of the number of occurrences of an event, the logarithmic count having a value stored in the memory. The instructions may further cause the computer system to determine bit positions having significance based on the value of the logarithmic count, generate a random number, and determine whether the random number has a non-zero bit in a position that corresponds with the bit positions having significance. When the random number does not have a non-zero bit in a position that corresponds with the bit positions having significance, the instructions may further cause the computer system to increase the logarithmic counter and store the logarithmic count in the memory. In some implementations, as part of determining bit positions having significance the instructions may further cause the computer system to create a bitmask with non-zero values in the bit positions having significance and zero values in the remaining bit positions.

According to yet another general aspect, a system may include a memory configured to store executable code, and a processor operably coupled to the memory. The processor may be arranged and configured to execute the code to detect a new occurrence of the event and retrieve, from a storage medium, a logarithmic count of the number of occurrences of an event, the logarithmic count having a value stored in the storage medium. The processor may further execute the code to determine bit positions having significance based on the value of the logarithmic count, generate a random number, and determine whether the random number has a non-zero bit in a position that corresponds with the bit positions having significance. When the random number does not have a non-zero bit in a position that corresponds with the bit positions having significance, the processor may further execute the code to increase the logarithmic counter and store the logarithmic count in the storage medium. In some implementations, as part of determining bit positions having significance the processor may further execute the instructions to create a bitmask with non-zero values in the bit positions having significance and zero values in the remaining bit positions.

Implementations can include one or more of the following features. For example, the detected events may be the occurrence of a shingle in one or more documents and the logarithmic count may be a binary based count. As another example, the system may as part of determining whether the random number has a non-zero bit the system may perform an AND operation between the bitmask and the random number; and determine whether the result of the AND operation is zero.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like elements.

DETAILED DESCRIPTION

Figure 1:
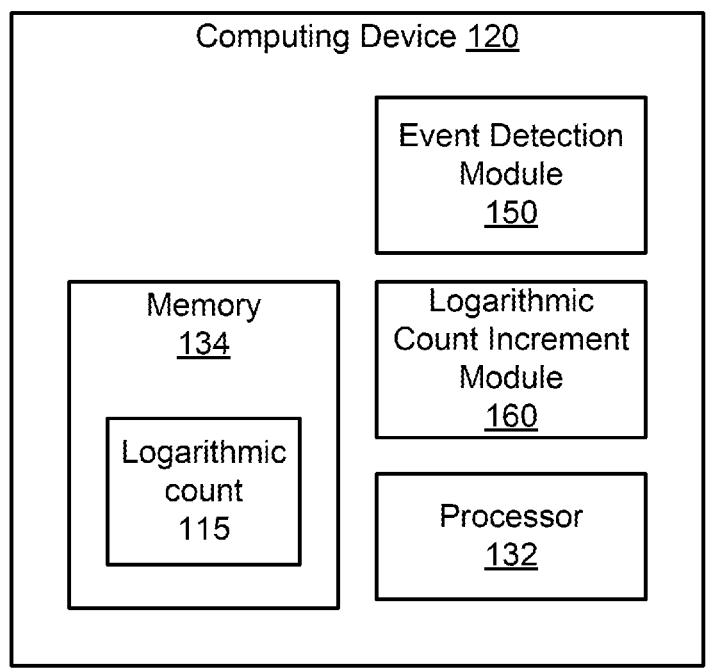
FIG. 1 is a schematic illustration of a computing device, consistent with some implementations.

Systems and methods consistent with example implementations provide a memory-conscious method of tracking the occurrence of events. For systems that process and store millions of records or more, memory management may take priority over precision. For example, a system storing billions of records may trade memory savings, in the form of smaller storage requirements, for an exact count of events. In such a system, a logarithmic count can replace an actual count at a substantial memory savings. In some implementations, the system provides a method for incrementing the count, making the use of a logarithmic count feasible for active counters that continue to count events.

In some implementations, a system provides a module that is called each time an event occurs. The module may use a random number to determine whether to increase the count. The module may accomplish this using an integer to store the logarithmic count, an unsigned bitmask having the same bit length as the logarithmic count, and a random number generator. If the system determines that no non-zero bits exist in the bits of the random number that have significance based on the current value of the logarithmic count, then the logarithmic count is increased. As the logarithmic count increases, the chances that no non-zero bits appear in the bit positions of significance grow smaller and, therefore, the logarithmic count is incremented more slowly.

Some implementations allow a system to store only a logarithmic counter for an event, saving memory space, while still allowing the counter to be incremented. For example, a search engine may use the estimated count of events to count the shingles occurring in a document corpus, and continue to update the count as new documents are added to the corpus. In such an example, the search engine may use the count to facilitate the creation of an index or to generate more accurate search results for a query processed using the index. For instance, when a search engine is indexing a document for its search index, the search engine may use the estimated count of shingles to determine a creation date for the document. More specifically, the search engine may identify the shingles in the document, ignoring those shingles with an estimated count that exceeds a predetermined threshold. Such shingles may be considered noise because they occur so frequently in the documents of the corpus that using the date of the first appearance of the shingle is unhelpful. Thus, only the remaining identified shingles may be used to calculate a date for the document. In another example, the search engine may use the estimated count to ignore phrases or words in a query with an estimated count that exceeds a threshold. Phrases or words with an extraordinarily high estimated count may be considered noise because they occur too frequently and may not be helpful in meaningfully narrowing the number of documents for the query. In another example, a system may monitor the estimated number of DNS requests for a particular URL to determine when the estimated number exceeds a threshold. Such an occurrence may be an indication of a denial of service attack or a malicious URL, depending on the circumstances. A memory-conscious event counter may also be useful in other situations where a very high number is a flag that something is no longer useful or is an indication of an event of interest.

FIG. 1 is a schematic illustration of a computing device 120 on which the event counting systems and methods described herein can be embodied. The computing device 120 can be, for example, a computing entity, for example a personal computing device, such as a laptop computer, a desktop computer, a netbook computer, a tablet, a touchpad, etc., a server device such as a web server, a mobile phone, a personal digital assistant (PDA), e-reader, and/or so forth. The computing device 120 may include a system such as system 400 or system 450 shown in FIG. 4, and can be, for example, a wired device and/or a wireless device (e.g., wi-fi enabled device). The computing device 120 can be configured to operate based on one or more platforms (e.g., one or more similar or different platforms) that can include one or more types of hardware, software, firmware, operating systems, runtime libraries, and/or so forth.

As shown in FIG. 1, the computing device 120 can include an event detection module 150 and a logarithmic count increment module 160. The computing device 120 can also include one or more processors 132, and a memory 134 that can store thereon one or more logarithmic counts 115. The computing device 120 can also include an output portion, such as a display, (not shown in FIG. 1) and an input portion, such as a keyboard, (not shown in FIG. 1).

In some implementations, the computing device 120 can represent a cluster of devices. In such an implementation, the functionality and processing of the computing device 120, such as one or more processors 132 of the computing device 120, can be distributed to several computing devices of the cluster of computing devices.

In some implementations, one or more portions of the components shown in the computing device 120 in FIG. 1 can be, or can include, a hardware-based module, such as a digital signal processor (DSP), a field programmable gate array (FPGA), a memory, etc., a firmware module, and/or a software-based module, such as a module of computer code, including a set of computer-readable instructions that can be executed at a computer. For example, in some implementations, one or more portions of the logarithmic count increment module 160 can be, or can include, a software module configured for execution by at least one processor (not shown). In some implementations, the functionality of the components can be included in different modules and/or components than those shown in FIG. 1. For example, although not shown, the functionality of the logarithmic count increment module 160 can be included in a different module, or divided into several different modules.

The components of the computing device 120 can be configured to operate within an environment that includes an operating system. In some implementations, the operating system can be configured to facilitate, for example, detection of events by the event detection module 150.

In some implementations, the computing device 120 can be included in a network. In some implementations, the network can include multiple computing devices (such as computing device 120) and/or multiple server devices (not shown). Also, although not shown in FIG. 1, the computing device 120 can be configured to function within various types of network environments. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can be have portions based on various protocols such as Internet Protocol (IP) and/or a proprietary protocol. The network can include at least a portion of the Internet.

The memory 134 of the computing device 120 can be any type of memory device such as a random-access memory (RAM) component or a disk drive memory. The memory 134 can be a local memory included in the computing device 120. Although not shown, in some implementations, the memory 134 can be implemented as more than one memory component, for example more than one RAM component or disk drive memory, within the computing device 120. In some implementations, the memory 134 can be, or can include, a non-local memory (e.g., a memory not physically included within the computing device 120) within a network (not shown). For example, the memory 134 can be, or can include, a memory shared by multiple computing devices (not shown) within a network. In some implementations, the memory 134 can be associated with a server device (not shown) on a client side of a network and configured to serve several computing devices on the client side of the network.

Logarithmic count 115 may be stored in memory 134 and can be, for example, a count of any type of event. In some implementations logarithmic count 115 may be represented in binary (base 2), hexadecimal (base 6), or any other base form. The logarithmic count 115 represents the exponent that the base is raised to, resulting in an estimated actual count in base 10. For example, if the logarithmic count 115 is a base 2 count and contains the value 4, the estimated decimal (i.e. base 10) count would be 16 to 31. The logarithmic count 115 may be stored with as many bits as needed to store the maximum expected count of events. In other words, if the logarithmic count 115 is a binary count and the maximum expected count is 65,536, then logarithmic count 115 may be stored as 5 bits. It is apparent that even if only 5 bits is needed to store the maximum expected count, logarithmic count 115 may be stored as a multiple of 8 bits.

The event detection module 150 can detect the occurrence of a specified event, such as the occurrence of a shingle in a document, a request for a particular URL, etc. When the event detection module 150 detects the occurrence of the event, it may work with logarithmic count increment module 160 to track the events and increment logarithmic count 115 when appropriate.

Figure 2:
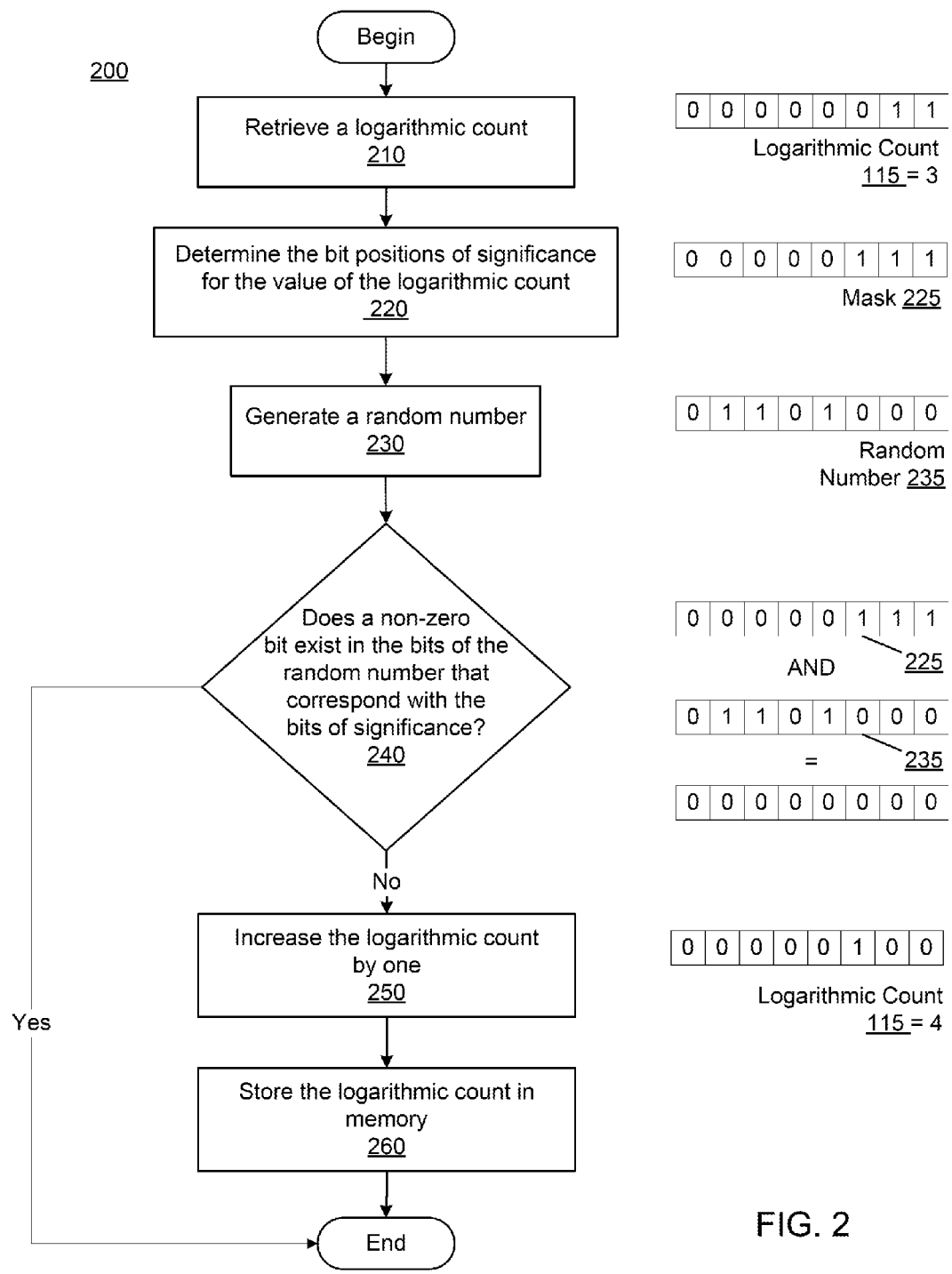
FIG. 2 illustrates a flow diagram of a process for incrementing a logarithmic count, consistent with some implementations.

FIG. 2 illustrates a flow diagram of a process 200 for incrementing a logarithmic counter and an example of data elements created and/or used in the process, consistent with some implementations. Process 200 may be used by an event counting system that tracks the number of times an event occurs. An event counting system, such as system 120 shown in FIG. 1, may include a computing system with a processor and a logarithmic count increment module that contains instructions executed by the processor. In an event counting system that counts the occurrences of a shingle, the logarithmic count may be stored in memory as an attribute of a shingle. In an event counting system that counts DNS requests for a specific URL, the logarithmic count may be stored in memory as an attribute of the URL. Embodiments are not limited to these examples, but may apply to a system that tracks any particular event.

To increment a logarithmic counter, the event counting system may retrieve the counter, such as counter 115, from memory (step 210). In some implementations, the event counting system may determine the bit positions of significance for the value of the logarithmic count (step 220). In other words, the event counting system may determine the bit positions needed to store a number one less than a minimum decimal equivalent for the logarithmic count. In the example shown in FIG. 2, logarithmic count 115 is a base 2 (i.e. log 2) count and has a current value of 3. Therefore the minimum decimal equivalent of logarithmic count 115 is seven because $2^3$ is eight. In order to store the number seven, at least three bits are required. Thus, in this example, there are three significant bits in the count 115. In some implementations the event counter system may create a bitmask, such as bitmask 225, to represent the significant bits, as will be explained in further detail with regard to FIG. 3 below.

The event counting system may also generate a random number (step 230), such as random number 235, which represents a random string of zero and non-zero bits. The event counting system may generate random number 235 using any method of generating random numbers, as is know in the art, including but not limited to the linear congruential generator, the multiply-with-carry, and operating system generators such as CryptGenRandom and /dev/random. The random number should have at least as many bits as bits needed to represent the maximum possible decimal equivalent of the logarithmic count 115. For purposes of simplicity, the example shown in FIG. 2 has a random number of 8 bits. Of course, random number 235 may be much larger than 8 bits, for example 32 or even 64 bits.

The event counting system may then determine whether any of the bits in the random number that correspond with the bit positions of significance for the logarithmic count 115 have a non-zero value (step 240). In other words, the system determines whether the random number has all zeros in the bit positions of significance, represented, for example, by bitmask 225. In some implementations, the event counting system will perform a logical AND operation between the bitmask 225 and the random number 235. Because the bitmask 225 has zeros in all bits that are not of significance and non-zero values in the bits of significance, only the bits in the random number that correspond with the non-zero bits in bitmask 225, which represent the bits of significance, can cause the result of the AND operation to be something other than zero. The bits of the random number that correspond to the bits of significance may be thought of as considered bits because only these bits affect the determination of whether to increment the logarithmic count 115. If any of these considered bits are non-zero (step 240, Yes) then the event counting system may not increment the logarithmic count 115 and process 200 may end. But if all of the considered bits are zero (step 240, No), then the event counting system may increment the logarithmic count 115 (step 250) and store the logarithmic count in memory (step 260). Process 200 may then end.

When the value of the logarithmic count 115 is small, not many bits in the random number will be considered. In other words, not many bits in the random number correspond to bits of significance in bitmask 225. Consequently it is likely that the considered bits will all be zero and the event counter system will increment the logarithmic count. As the logarithmic count grows, the number of bits of significance also grows, increasing the number of bits of the random number that the event counting system considers. Accordingly the likelihood that all considered bits in the random number are zero becomes small, resulting in more and more infrequent updates of the logarithmic count. In this manner, the event counting system may update a logarithmic count frequently if only a few occurrences of an event have been detected and much less frequently when the system has detected thousands or millions of occurrences of the event.

Figure 3:
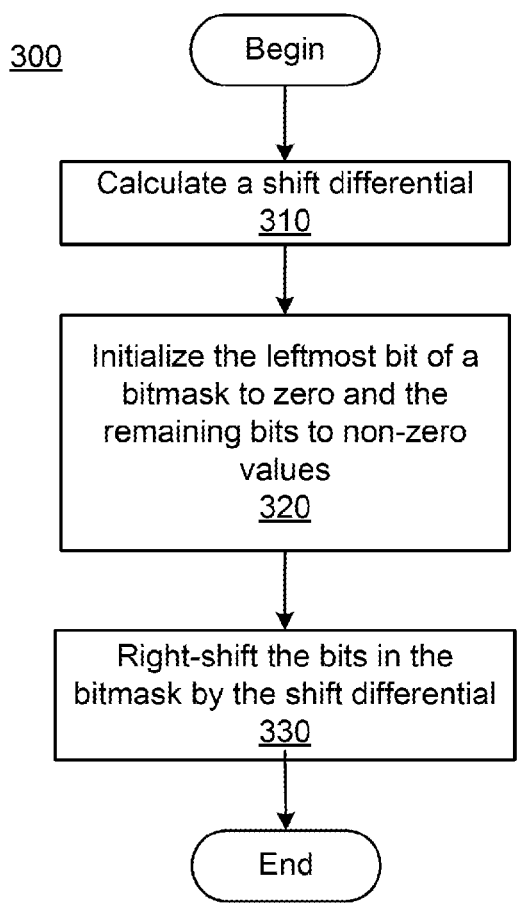
FIG. 3 illustrates a flow diagram of a process for determining bit positions of significance for the logarithmic count, consistent with some implementations.

FIG. 3 illustrates a flow diagram of a process 300 for determining bit positions of significance for the logarithmic count, consistent with implementations of this disclosure. The event counting system may use process 300 as part of step 220 of FIG. 2. As part of process 300 the event counting system may calculate a shift differential (step 310). A shift differential is the number of bit positions that the bitmask will be shifted so that the non-zero bits occupy only positions of significance. In some implementations, the shift differential represents the difference between the number one less than the number of bits in the bitmask (e.g. 31 bits) and the value of the logarithmic count. In the example shown in FIG. 3, where the bitmask has 8 bits and the logarithmic count 115 has a value of 3, the event counting system may calculate a shift differential of 4. The event counting system may also initialize the leftmost bit of a bitmask to zero and the remaining bits of the bitmask to non-zero (step 320). The event counting system may then use the shift differential to right-shift the bits in the bitmask (step 330). The right-shift causes the bits in the bitmask to move to the right, with zeros padding the left. In the example shown in FIG. 3, the initialized bitmask 325 changes to bitmask 225 as a result of the right-shift operation. As can be seen in the example, the left-most bits in the bitmask are set to zero as the non-zero bits are shifted to the right. This results in a bitmask 225 with non-zero values in the bit positions of significance. In the example of FIG. 3, the rightmost three bits are bits of significance because it takes at least three bits to represent the decimal number seven, which is one less than the minimum decimal equivalent represented by the current value of the logarithmic count 115. Process 300 then ends.

The process shown in FIGS. 2 and 3 are an example of implementations, and may have steps deleted, reordered, or modified. For example, steps 310 and 320 may be combined or reversed or steps 310, 320, and 330 may be combined. For example, the three steps may be combined using in a single line of code, such as mask=(0x7fffffffu>>(31−logCount)). In some implementations, steps 240 to 260 may be combined using a single line of code, such as logCount+=((random( )& mask)==0)).

Figure 4:
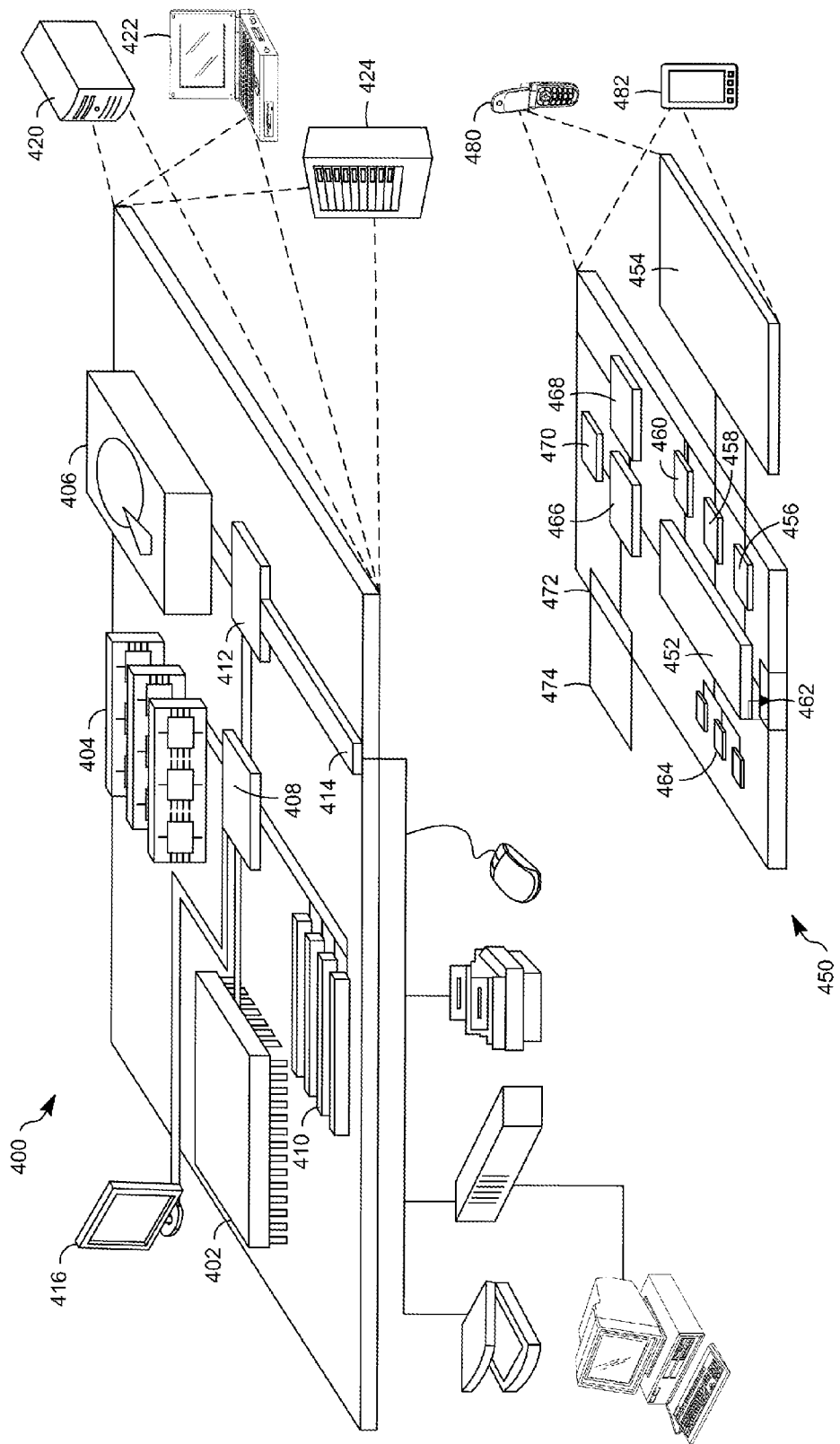
FIG. 4 shows an example of a computer device and a mobile computer device that can be used to implement the described techniques.

FIG. 4 shows an example of a generic computer device 400 and a generic mobile computer device 450, which may be used with the techniques described here. Computing device 400 is intended to represent various forms of digital computers, such as laptops, netbooks, tablets, desktops, workstations, personal digital assistants, servers, blade servers, mainframes, and other appropriate computers. Computing device 450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 400 includes a processor 402, memory 404, a storage device 406, a high-speed interface 408 connecting to memory 404 and high-speed expansion ports 410, and a low speed interface 412 connecting to low speed bus 414 and storage device 406. Each of the components 402, 404, 406, 408, 410, and 412, are interconnected using various buses, and may be mounted on a common motherboard or in other manners as appropriate. The processor 402 can process instructions for execution within the computing device 400, including instructions stored in the memory 404 or on the storage device 406, to display graphical information for a GUI on an external input/output device, such as display 416 coupled to high speed interface 408. In other implementations, multiple processors and/or multiple buses may be used, as appropriate, along with multiple memories and types of memory. Also, multiple computing devices 400 may be connected, with each device providing portions of the necessary operations (e.g., as a server bank, a group of blade servers, or a multi-processor system).

The memory 404 stores information within the computing device 400. In one implementation, the memory 404 is a volatile memory unit or units. In another implementation, the memory 404 is a non-volatile memory unit or units. The memory 404 may also be another form of computer-readable medium, such as a magnetic or optical disk.

The storage device 406 is capable of providing mass storage for the computing device 400. In one implementation, the storage device 406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 404, the storage device 406, or memory on processor 402.

The high speed controller 408 manages bandwidth-intensive operations for the computing device 400, while the low speed controller 412 manages lower bandwidth-intensive operations. Such allocation of functions is exemplary only. In one implementation, the high-speed controller 408 is coupled to memory 404, display 416 (e.g., through a graphics processor or accelerator), and to high-speed expansion ports 410, which may accept various expansion cards (not shown). In the implementation, low-speed controller 412 is coupled to storage device 406 and low-speed expansion port 414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 400 may be implemented in a number of different forms, as shown in the figure. For example, it may be implemented as a standard server 420, or multiple times in a group of such servers. It may also be implemented as part of a rack server system 424. In addition, it may be implemented in a personal computer such as a laptop computer 422. Alternatively, components from computing device 400 may be combined with other components in a mobile device (not shown), such as device 450. Each of such devices may contain one or more of computing device 400, 450, and an entire system may be made up of multiple computing devices 400, 450 communicating with each other.

Computing device 450 includes a processor 452, memory 464, an input/output device such as a display 454, a communication interface 466, and a transceiver 468, among other components. The device 450 may also be provided with a storage device, such as a microdrive or other device, to provide additional storage. Each of the components 450, 452, 464, 454, 466, and 468, are interconnected using various buses, and several of the components may be mounted on a common motherboard or in other manners as appropriate.

The processor 452 can execute instructions within the computing device 450, including instructions stored in the memory 464. The processor may be implemented as a chipset of chips that include separate and multiple analog and digital processors. The processor may provide, for example, for coordination of the other components of the device 450, such as control of user interfaces, applications run by device 450, and wireless communication by device 450.

Processor 452 may communicate with a user through control interface 458 and display interface 456 coupled to a display 454. The display 454 may be, for example, a TFT LCD (Thin-Film-Transistor Liquid Crystal Display) or an OLED (Organic Light Emitting Diode) display, or other appropriate display technology. The display interface 456 may comprise appropriate circuitry for driving the display 454 to present graphical and other information to a user. The control interface 458 may receive commands from a user and convert them for submission to the processor 452. In addition, an external interface 462 may be provided in communication with processor 452, so as to enable near area communication of device 450 with other devices. External interface 462 may provide, for example, for wired communication in some implementations, or for wireless communication in other implementations, and multiple interfaces may also be used.

The memory 464 stores information within the computing device 450. The memory 464 can be implemented as one or more of a computer-readable medium or media, a volatile memory unit or units, or a non-volatile memory unit or units. Expansion memory 474 may also be provided and connected to device 450 through expansion interface 472, which may include, for example, a SIMM (Single In Line Memory Module) card interface. Such expansion memory 474 may provide extra storage space for device 450, or may also store applications or other information for device 450. Specifically, expansion memory 474 may include instructions to carry out or supplement the processes described above, and may include secure information also. Thus, for example, expansion memory 474 may be provided as a security module for device 450, and may be programmed with instructions that permit secure use of device 450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 464, expansion memory 474, or memory on processor 452, that may be received, for example, over transceiver 468 or external interface 462.

Device 450 may communicate wirelessly through communication interface 466, which may include digital signal processing circuitry where necessary. Communication interface 466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 468. In addition, short-range communication may occur, such as using a Bluetooth, WiFi, or other such transceiver (not shown). In addition, GPS (Global Positioning System) receiver module 470 may provide additional navigation- and location-related wireless data to device 450, which may be used as appropriate by applications running on device 450.

Device 450 may also communicate audibly using audio codec 460, which may receive spoken information from a user and convert it to usable digital information. Audio codec 460 may likewise generate audible sound for a user, such as through a speaker, e.g., in a handset of device 450. Such sound may include sound from voice telephone calls, may include recorded sound (e.g., voice messages, music files, etc.) and may also include sound generated by applications operating on device 450.

The computing device 450 may be implemented in a number of different forms, as shown in the figure. For example, it may be implemented as a cellular telephone 480. It may also be implemented as part of a smart phone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network).

Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A computer-implemented method of managing memory usage while tracking an estimated number of occurrences of an event, the method comprising:
    detecting a new occurrence of the event;
    retrieving, from a memory, a logarithmic count of the estimated number of occurrences of the event, the logarithmic count having a value stored in the memory;
    determining, by at least one processor of a computer system, bit positions having significance based on the value of the logarithmic count;
    generating, by the at least one processor of the computer system, a random number;
    determining, by the at least one processor of the computer system, whether the random number has a non-zero bit in a position that corresponds with the bit positions having significance;
    increasing the value of the logarithmic count when the random number does not have a non-zero bit in a position that corresponds with the bit positions having significance; and
    storing the logarithmic count in the memory after the increasing.

2. The method of claim 1, wherein determining the bit positions having significance comprises:
    creating a bitmask with non-zero values in the bit positions having significance and zero values in remaining bit positions, the bitmask using a particular number of bits in the memory.

3. The method of claim 2, wherein creating the bitmask includes calculating a shift differential by:
    initializing a leftmost bit in the bitmask to zero and initializing remaining bits in the bitmask to non-zero values; and
    right-shifting the bits in the bitmask by the shift differential, resulting in non-zero values in the bit positions having significance and zero value in all other bit positions.

4. The method of claim 3, wherein calculating the shift differential includes:
    subtracting the value of the logarithmic count from the particular number of bits less one.

5. The method of claim 2, wherein determining whether the random number has a non-zero bit includes:
    performing an AND operation between the bitmask and the random number; and
    determining whether a result of the AND operation is zero.

6. The method of claim 1, wherein the logarithmic count is a binary based logarithmic count.

7. The method of claim 1, wherein the bit positions having significance represent a number of bits needed to store a number one fewer than a decimal equivalent of the value of the logarithmic count.

8. The method of claim 1, wherein the event is an occurrence of a shingle located in one or more documents.

9. A tangible computer-readable storage medium for managing memory usage when tracking an estimated number of occurrences of an event, the storage medium having recorded and embodied thereon instructions that, when executed by one or more processors of a computer system, cause the computer system to:
    detect a new occurrence of the event;
    retrieve, from a memory, a logarithmic count of the estimated number of occurrences of the event, the logarithmic count having a value stored in the memory;
    determine bit positions having significance based on the value of the logarithmic count;
    generate a random number;
    determine whether the random number has a non-zero bit in a position that corresponds with the bit positions having significance;
    increase the value of the logarithmic count when the random number does not have a non-zero bit in a position that corresponds with the bit positions having significance;
    and store the logarithmic count in the memory after the increasing.

10. The computer-readable storage medium of claim 9, wherein as part of determining the bit positions having significance, the instructions further cause the one or more processors to:
    create a bitmask with non-zero values in the bit positions having significance and zero values in remaining bit positions, the bitmask using a particular number of bits in the memory.

11. The computer-readable storage medium of claim 10, wherein as part of creating the bitmask, the instructions further cause the one or more processors to:
    calculate a shift differential by subtracting the value of the logarithmic count from the particular number of bits less one;
    initialize a leftmost bit in the bitmask to zero and initialize remaining bits in the bitmask to non-zero values; and
    right-shift the bits in the bitmask by the shift differential, resulting in non-zero values in the bit positions having significance and zero value in all other bit positions.

12. The computer-readable storage medium of claim 10, wherein as part of the determining whether the random number has a non-zero bit the instructions further cause the one or more processors to:
    perform an AND operation between the bitmask and the random number; and
    determine whether a result of the AND operation is zero.

13. The computer-readable storage medium of claim 9, wherein the logarithmic count is a binary based logarithmic count.

14. The computer-readable storage medium of claim 9, wherein the event is an occurrence of a shingle located in one or more documents.

15. A system for managing memory usage when tracking an estimated number of occurrences of an event comprising:
    a memory configured to store executable code;
    a storage medium; and a processor operably coupled to the memory, the processor configured to execute the code to:

detect a new occurrence of the event, retrieve, from the storage medium, a logarithmic count of the estimated number of occurrences of the event, the logarithmic count having a value stored in the storage medium, determine bit positions having significance based on the value of the logarithmic count, generate a random number, determine whether the random number has a non-zero bit in a position that corresponds with the bit positions having significance, increase the value of the logarithmic count when the random number does not have a non-zero bit in a position that corresponds with the bit positions having significance, and store the logarithmic count in the storage medium after the increasing.

16. The system of claim 15, wherein as part of determining the bit positions having significance the processor is further configured to execute the code to:

create a bitmask with non-zero values in the bit positions having significance and zero values in remaining bit positions, the bitmask using a particular number of bits in the storage medium.

17. The system of claim 16, wherein as part of creating the bitmask the processor is further configured to execute the code to:

calculate a shift differential by subtracting the value of the logarithmic count from the particular number of bits less one;

initialize a leftmost bit in the bitmask to zero and initialize remaining bits in the bitmask to non-zero values; and right-shift the bits in the bitmask by the shift differential, resulting in non-zero values in the bit positions having significance and zero value in all other bit positions.

18. The system of claim 16, wherein as part of the determining whether the random number has a non-zero bit the processor is further configured to execute the code to:

perform an AND operation between the bitmask and the random number; and determine whether a result of the AND operation is zero.

19. The system of claim 15, wherein the logarithmic count is a binary based logarithmic count.

20. The system of claim 15, wherein the event is an occurrence of a shingle located in one or more documents.

21. The system of claim 20, wherein when the shingle matches a particular shingle in a first document, the processor is further configured to determine the shingle is irrelevant when the estimated number of occurrences for the shingle exceeds a threshold.

* * * * *